US012695056B2

(12) United States Patent
Renau et al.

(10) Patent No.: US 12,695,056 B2
(45) Date of Patent: Jul. 28, 2026

(54) APPARATUS AND TECHNIQUES FOR SUBSTRATE PROCESSING USING INDEPENDENT ION SOURCE AND RADICAL SOURCE

(71) Applicant: APPLIED Materials, Inc., Santa Clara, CA (US)

(72) Inventors: Anthony Renau, West Newbury, MA (US); Joseph C. Olson, Beverly, MA (US); Peter F. Kurunczi, Cambridge, MA (US)

(73) Assignee: Applied Materials, Inc., Santa Clara, CA (US)

( * ) Notice: Subject to any disclaimer, the term of this patent is extended or adjusted under 35 U.S.C. 154(b) by 139 days.

(21) Appl. No.: 18/662,669

(22) Filed: May 13, 2024

(65) Prior Publication Data

US 2024/0297016 A1 Sep. 5, 2024

Related U.S. Application Data

(63) Continuation of application No. 17/093,139, filed on Nov. 9, 2020, now Pat. No. 11,996,266.
(Continued)

(51) Int. Cl.
*H01J 37/304* (2006.01)
*H01J 37/20* (2006.01)

(52) U.S. Cl.
CPC ............ *H01J 37/304* (2013.01); *H01J 37/20* (2013.01); *H01J 2237/201* (2013.01)

(58) Field of Classification Search
CPC .... H01J 37/304; H01J 37/20; H01J 2237/201; H01J 2237/202; H01J 2237/303;
(Continued)

(56) References Cited

U.S. PATENT DOCUMENTS 4,734,158 A * 3/1988 Gillis .................. H01L 21/3065
438/712
4,874,459 A * 10/1989 Coldren .............. H01J 37/3053
438/711
(Continued)

FOREIGN PATENT DOCUMENTS

CN 1638015 A 7/2005
CN 107851576 A 3/2018
(Continued)

OTHER PUBLICATIONS

International Search Report and Written Opinion for the International Application No. PCT/US2020/061693, dated Mar. 11, 2021, 8 pages.

*Primary Examiner* — Michael Maskell
(74) *Attorney, Agent, or Firm* — KDW Firm PLLC

(57) ABSTRACT

A system may include a substrate stage to support a substrate, and a plurality of beam sources. The plurality of beam sources may include an ion beam source, the ion beam source arranged to direct an ion beam to the substrate, and a radical beam source, the radical beam source arranged to direct a radical beam to the substrate. The system may include a controller configured to control the ion beam source and the radical beam source to operate independently of one another, in at least one aspect, wherein the at least one aspect includes beam composition, beam angle of incidence, and relative scanning of a beam source with respect to the substrate.

16 Claims, 2 Drawing Sheets

Related U.S. Application Data

(60) Provisional application No. 62/942,430, filed on Dec. 2, 2019.

(58) Field of Classification Search
CPC ..... H01J 2237/30472; H01J 2237/3142; H01J 2237/3151; H01J 2237/31701
USPC ............................................ 250/492.1–492.3
See application file for complete search history.

(56) References Cited

U.S. PATENT DOCUMENTS

| | | | | |
|---|---|---|---|---|
| 4,874,460 | A | * | 10/1989 | Nakagawa ................. G03F 1/74 |
| | | | | 216/61 |
| 4,994,140 | A | * | 2/1991 | Kenzo ............... H01L 21/02661 |
| | | | | 156/345.31 |
| 5,350,926 | A | | 9/1994 | White |
| 5,376,791 | A | * | 12/1994 | Swanson ........... H01L 21/32136 |
| | | | | 250/307 |
| 6,355,559 | B1 | | 3/2002 | Havemann |
| 10,879,055 | B2 | * | 12/2020 | Hatem .............. H01J 37/32376 |
| 2005/0181584 | A1 | * | 8/2005 | Foad ...................... H01J 37/304 |
| | | | | 438/514 |
| 2017/0271128 | A1 | | 9/2017 | Ninomiya |
| 2020/0027707 | A1 | * | 1/2020 | Hatem ............. H01L 21/31116 |

FOREIGN PATENT DOCUMENTS

| | | | |
|---|---|---|---|
| JP | S62265725 | A | 11/1987 |
| JP | H01232651 | A | 9/1989 |
| JP | H01503094 | A | 10/1989 |
| JP | H09205092 | A | 8/1997 |
| JP | H11288922 | A | 10/1999 |
| JP | 2003239064 | A | 8/2003 |
| JP | 2013243307 | A | 12/2013 |
| JP | 2015220287 | A | 12/2015 |
| TW | 201903808 | A | 1/2019 |
| TW | 1659450 | B | 5/2019 |
| TW | 201931420 | A | 8/2019 |
| WO | 2020018262 | A1 | 1/2020 |

* cited by examiner

PROVIDE SUBSTRATE IN PROCESS CHAMBER
202

DIRECT ION BEAM FROM ION BEAM SOURCE TO SUBSTRATE
204

DIRECT RADICAL BEAM FROM RADICAL BEAM SOURCE TO
SUBSTRATE, SEPARATE FROM ION BEAM SOURCE
206

SCAN SUBSTRATE WITH RESPECT TO ION BEAM SOURCE OR
RADICAL BEAM SOURCE OR BOTH ALONG FIRST AXIS
208

200

APPARATUS AND TECHNIQUES FOR SUBSTRATE PROCESSING USING INDEPENDENT ION SOURCE AND RADICAL SOURCE

RELATED APPLICATIONS

This application is a continuation to U.S. patent application Ser. No. 17/093,139, filed Nov. 9, 2020, now U.S. Pat. No. 11,996,266, which claims priority to U.S. provisional patent application Ser. No. 62/942,430, filed Dec. 2, 2019, all entitled "APPARATUS AND TECHNIQUES FOR SUBSTRATE PROCESSING USING INDEPENDENT ION SOURCE AND RADICAL SOURCE". The contents of the aforementioned applications are incorporated by reference herein in their entirety.

FIELD

This disclosure relates to substrate processing and more particularly to processing using multiple different sources to generate ions and radicals.

BACKGROUND

Processing of substrates to form devices, such as electronic devices, optical devices, mechanical devices, and so forth, often involves the use of energetic species, such as ions and radicals. In known etching or deposition systems, for example, a substrate may be exposed to a processing plasma to perform a given deposition or etching operation. In some variants, a processing ion beam may be extracted from a plasma and directed to the substrate. Notably, the processing plasma or processing ion beam may include excited species in the form of ions and radicals. Both ions and radicals may influence the properties of a substrate being processed. For example, ions and radicals may both contribute to etching or deposition. Notably, ions may tend to generate etching, while radicals may tend to generate deposition. However, the relative concentration of ions and radicals may be difficult to control, as well as the trajectories of such species.

With respect to these and other considerations, the present embodiments are provided.

BRIEF SUMMARY

In one embodiment, a system a substrate stage to support a substrate; a plurality of beam sources, comprising: an ion beam source, the ion beam source arranged to direct an ion beam to the substrate; and a radical beam source, the radical beam source arranged to direct a radical beam to the substrate. The system may include a controller configured to control the ion beam source and the radical beam source to operate independently of one another, in at least one aspect, wherein the at least one aspect includes beam composition, beam angle of incidence, and relative scanning of a beam source with respect to the substrate.

In another embodiment, a method may include providing a substrate in a process chamber, and directing an ion beam to the substrate from an ion beam source. The method may also include directing a radical beam to the substrate from a radical beam source, separate from the ion beam source, wherein the ion beam differs from the radical beam in at least one aspect, the at least one aspect including beam composition, beam angle of incidence, relative scanning of a beam source with respect to the substrate.

In a further embodiment, a processing system may include a housing, a substrate stage disposed within the housing, an ion beam source, the ion beam source arranged within the housing, to direct an ion beam to the substrate stage; and a radical beam source, the radical beam source arranged within the housing to direct a radical beam to the substrate. The processing system may further include a controller configured to control the ion beam source and the radical beam source to operate independently of one another, in at least one aspect, wherein the at least one aspect includes beam composition, beam angle of incidence, and relative scanning of a beam source with respect to the substrate.

BRIEF DESCRIPTION OF THE DRAWINGS

The accompanying drawings illustrate exemplary approaches of the disclosure, including the practical application of the principles thereof, as follows.

Figure 1A:
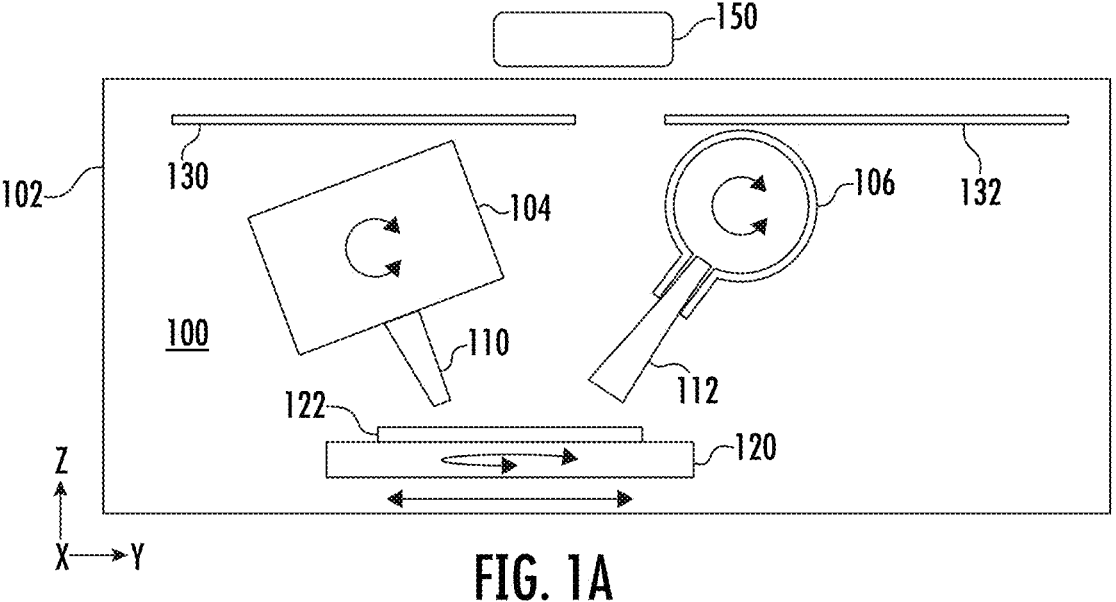
FIG. 1A and FIG. 1B show a side view and top plan schematic view of an exemplary system.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel apparatus and techniques for substrate processing. Various embodiments employ a combination of separate ion beam source(s) and separate radical beam source(s) to perform substrate processing, where a radical beam source is independently adjustable with respect to an ion beam source. Radicals may include a variety of components produced by a plasma, not including electrons for example, while ions may include charged particles produced in a plasma, again, not including electrons. Non-limiting examples of ions may include inert gas ions, hydrogen ions, oxygen ions, nitrogen ions, reactive ions, ions based upon carbon, ions based upon hydrocarbons, ions based upon fluorocarbons, and so forth. Non-limiting examples of radicals may include radicals based upon carbon, hydrocarbons, fluorocarbons, chlorocarbons, hydrogen, oxygen, nitrogen, or other suitable gaseous species. According to various embodiments, an apparatus or system may arrange a radical beam source and ion beam source to process a substrate in a sequential manner, or alternatively, in a concurrent manner. In particular embodiments, a substrate may be processed independently by a radical beam source and ion beam source, where the processing may include any suitable combination of etching, deposition, implantation, doping, or other processing technique associated with energetic particles, such as ions and radicals.

In accordance with some embodiments, an ion beam as disclosed herein, may be provided as a mass analyzed ion beam, or as a non-mass analyzed ion beam. The ion beam may be provided as a ribbon ion beam or as a spot beam, in different embodiments. In various embodiments, the ion beam may be provided as a convergent ion beam, a collimated ion beam, or a divergent ion beam. The ion beam may be provided as a directional beam, where an average angle of incidence of the ion beam may be fixed or adjustable. In some embodiments, the ion beam source may be arranged to direct an ion beam along a perpendicular (normal) to a main plane of a substrate, such as a main surface of a semiconductor wafer. In other embodiments, the ion beam source may be arranged to direct an ion beam off-normal, meaning at a non-zero angle of incidence with respect to the normal to the main plane of the substrate.

Likewise, in various embodiments a radical beam may be directed to a substrate, independently of an ion beam, where the angle of incidence of the radical beam may be along a normal to a substrate plane, or may directed off normal to the substrate. Because the radical beam may be supplied from a radical beam source, separated from an ion beam source, the chemistry and accordingly radical species, directed to a substrate, may be independently controlled with respect to the species provided in an ion beam, including ions.

In accordance with various non-limiting embodiments, a radical generator used to generate radicals for a radical beam source may be an RF plasma source, a thermal source, an electron beam source, or a hot cathode source. The radical beam source may be configured to provide a radical beam as a spot beam, or alternatively as a ribbon radical beam.

In accordance with various non-limiting embodiments, an apparatus or system as disclosed herein may include a scanning system, arranged with any suitable combination of substrate scanner, ion beam source scanner, and radical beam source scanner. The system may accordingly generate a suitable relative motion of a substrate with respect to an ion beam source and/or radical beam source. In accordance with various embodiments, a scanning system may be arranged with an air bearing, SCARA (Selective Compliance Assembly Robot Arm) robot, or conventional robot, or other known scanning components.

In various embodiments of the disclosure, a control system is provided to separately control the output conditions of a radical beam source and the output conditions of an ion beam source. The separate control may include coordination of the output of a radical beam source and an ion beam source so as to provide a targeted combination of radical beam treatment and ion beam treatment to a substrate.

In some embodiments, the substrate may be arranged in a common process chamber where processing by both a radical beam source and an ion beam source takes place. In particular embodiments, a barrier, such as a gas curtain or septum may be provided within a processing chamber or processing station, to provide at least partial isolation of ion beam processing from radical beam processing.

FIG. 1A depicts a system 100, arranged in accordance with embodiments of the disclosure. The system 100 may include multiple beam sources, including an ion beam source 104 and a radical beam source 106, where in some embodiments, the multiple beam sources may be arranged within a common structure or housing, shown as housing 102. The ion beam source 104 may generate an ion beam 110 so as to impact a substrate 122, to perform a given substrate processing operation. The ion beam source 104 may include an ion chamber, such as a plasma chamber, where a plasma is generated by known methods, including RF excitation, hot cathode, indirectly heated cathode, or other known technique. The ion beam source 104 may further include known extraction components to extract and direct the ion beam 110 to the substrate 122.

The radical beam source 106 may generate a radical beam 112 to impact the substrate 122 so as to process the substrate 122 independently of the processing of the substrate 122 that is performed by the ion beam 110. In accordance with some non-limiting embodiments, the radical beam source 106 may incorporate or may be coupled to a radical generator (not separately depicted) arranged to generate radicals for the radical beam source 106, where the radical generator is an RF plasma source, a thermal source, an electron beam source, or a hot cathode source.

The system 100 further may include a substrate stage 120, to support a substrate 122, where the substrate stage 120 may be disposed in a process chamber. In the embodiment of FIG. 1A the process chamber is generally defined by the housing 102, while other configurations are possible. A controller 150 is also provided in the system 100, to control operation of various components of the system 100, detailed below. For example, the controller 150 may control the ion beam source 104 and radical beam source 106 to operate independently of one another in at least one aspect. As an example, the controller 150 may control gas species provided to ion beam source 104 and radical beam source 106 so that the beam composition differs between the ion beam source 104 and radical beam source 106. The controller 150 may control the ion beam source 104 to generate a same angle of incidence or a different angle of incidence for the ion beam 110, as compared to the angle of incidence of radical beam 112. In addition, the controller 15 may send control signals to adjust the relative scanning of a beam source, such as the ion beam source 104 or radical beam source 106, with respect to the substrate 122.

In different embodiments the relative scanning may be accomplished using a scan component of the substrate stage 120 (not separately shown) to scan the substrate 122 while the ion beam source 104 and radical beam source 106 are stationary. In other embodiments, the ion beam source 104, radical beam source 106, or both beam sources may be translated or scanned with respect to the substrate 122 while the substrate stage is stationary, using a scan component 130 or scan component 132, respectively. Notably, in some implementations, the controller 150, in conjunction with the scan component 130 and scan component 132, may generate independent movement of the ion beam source 104 and radical beam source 106 with respect to one another. In other implementations, the controller 150 may control the ion beam source 104 and radical beam source 106 to scan in concert with one another with respect to the substrate 122. In still further embodiments, the ion beam source 104 may be scanned in conjunction with simultaneous scanning of the substrate stage 120, the radical beam source 106 may be scanned in conjunction with simultaneous scanning of the substrate stage 120, or both ion beam source 104 and radical beam source 106 may be scanned in conjunction with simultaneous scanning of the substrate stage 120.

Figure 1B:
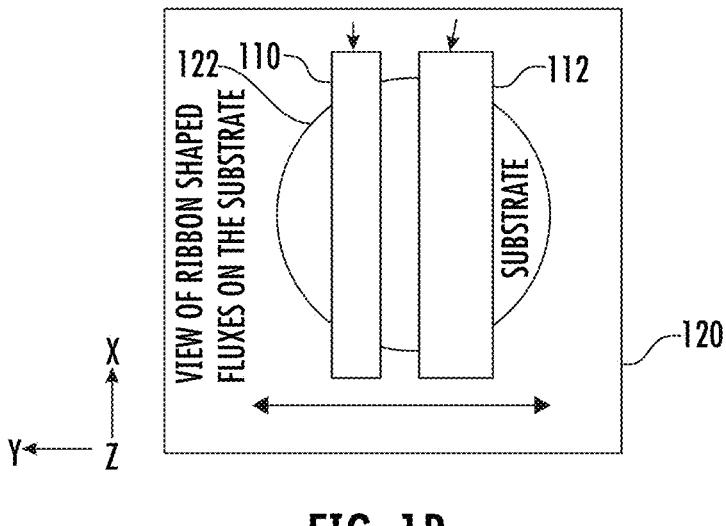

In various embodiments, the ion beam source 104 may generate a spot shaped ion beam (spot beam), while in other embodiments the ion beam source 104 may generate the ion beam 110 as a ribbon ion beam as shown in FIG. 1B. To generate a ribbon ion beam, an extraction assembly may include rectangular and elongated extraction apertures to generate the ion beam 110, having a generally rectangular cross-section, as shown in FIG. 1B. The aspect ratio of the extraction apertures, as well as the ion beam (X-dimension/

Y-dimension) may be 2/1, 3/1, 5/1, 10/1, 50/1 or greater according to various non-limiting embodiments. Similarly, the radical beam source 106 may generate the radical beam 112 as a spot beam or as a ribbon shaped radical beam, as shown in FIG. 1B. According to some embodiments, a substrate 122 may be scanned (along the Y-axis of the Cartesian coordinate system shown, to sequentially expose the same area of a substrate 122 to the ion beam 110 and radical beam 112. Notably, the substrate stage 120 may be provided with rotational capability, to rotate the substrate about an axis normal to the main plane of the substrate stage (in the configuration of FIG. 1A the main plane is represented by the X-Y plane and the normal by the Z-axis). In the case of a spot beam system, the relative scanning may be two dimensional rather than linear, consisting of motion in the X-Y plane rather than purely along the Y axis. For example, the substrate stage 120 may be scanned within a scan plane (such as the X-Y plane) in a combination of movement in both an X-direction and Y-direction with respect to a spot shaped ion beam. The substrate stage 120 may also be scanned in a combination of movement in in both an X-direction and Y-direction with respect to a spot shaped radical beam. Moreover, an ion beam source generating a spot beam and/or a radical source generating a spot beam, may be translated with respect to a substrate stage 120 in both an X-direction and Y-direction.

In various non-limiting embodiments, the ion beam source 104 may include either a noble gas, nitrogen, oxygen, hydrogen, hydrocarbons $C_yH_x$, halogen containing molecules (($C_xF_y$, $NF_x$, $SF_x$, etc), or any combination of the above. In various implementations, the ion beam source 104 may be biased with respect to the substrate 122 at a given extraction potential, to generate a given ion energy to the ion beam 110. In various embodiments, the ion beam source 104 may be rotatable to direct the ion beam 110 along a trajectory forming a given angle of incidence ($\square$ - ) with respect to a perpendicular (Z-axis) to the main plane (X-Y) of the substrate stage 120 and substrate 122, which plane therefore is defined by the main surface of a substrate 122, such as a wafer surface. The value of this angle of incidence may range from zero degrees (meaning that the beam trajectory is along the Z-axis) to 85 degrees in various non-limiting embodiments.

In various embodiments, the radical beam 112 may include neutrals. The radicals of radical beam 112 may include reactive radicals generated from a plasma, including halogen containing molecular gases ($C_xF_y$, $NF_x$, $SF_x$, etc), in addition to a mix of other gases (noble gases, oxygen, nitrogen, hydrogen, hydrocarbons $C_yH_x$, etc), depending on the processing application for radical beam source 106. The radical beam source 106 may include an aperture so as to direct the radical beam 112 along a given angle of incidence with respect to the perpendicular (Z-axis). The value of the angle of incidence (($\square_R$)) for radical beam 112 may be set by the controller 150 to be the same as the angle $\square$ _ $\square$ of ion beam 110, or different from the angle of ion beam 110.

Similarly to ion beam 106, the radical beam 112 may be elongated along the X-axis in some embodiments, as shown in FIG. 1B. According to various embodiments of the disclosure, because the radical beam source 106 may be separately powered and separately supplied with gas from the ion beam source 104, the ratio of radical flux to ion flux directed to the substrate 122 in a given processing operation may be independently controlled, providing a tunable process for directing radicals and ions. Generally, the radical beam 112 may include mostly reactive neutrals with some fraction of ions. For example, the input gas may be $CF_4$ (carbon tetrafluoride). By itself $CF_4$ is very inert (like inert argon or $N_2$), but when dissociated in the plasma (by the plasmas energetic electrons) the parent $CF_4$ will be broken up into daughter fragments such as $CF_3$, $CF_2$, CF, F, C. The fluorine containing daughter fragments that now have an open bond are chemically reactive and useful for a surface etching process. In addition to generating neutral CFx radicals, there will also be ionized radicals like $CFx^+$ as well, while the overall flux is mostly neutrals in various embodiments.

In various embodiments, the substrate 122 may be scanned along the Y axis of the Cartesian coordinate system shown, where the main substrate surface is arranged parallel to the X-Y plane during scanning. In the illustration of FIG. 1A, the substrate 122 scans horizontally (along the Y-axis) through a flux of ions and radicals impinging at different non-zero angles of incidence. However, the relative orientation of the radical beam 112 and ion beam 110 with respect to one another is shown merely to illustrate that the different beams may be independently controlled and may define different angles of incidence. In other embodiments, the apparatus of FIG. 1A may be oriented wherein the substrate 122 scans vertically, with the various components depicted in FIG. 1A arranged to have the same relative orientation to one another. The outputs of both the ion beam source 104 and the radical beam source 106 are accordingly directed co-linearly along the same non-zero angle with respect to a substrate scan direction (Y-axis), and are thus able to achieve an isocentric process (allowing for a spread of angles about a mean non-zero angle of incidence).

As noted, to generate an ion beam at a non-zero angle of incidence with respect to the Z-axis (perpendicular to substrate plane or scan plane), in one embodiment, an entire ion beam source, such as ion beam source 104, may be tilted with respect to the scan plane (X-Z plane), as suggested in FIG. 1A. number of electrodes).

Regarding the radical beam source 106, a nozzled structure or other similar configuration may be included to provide collimation of the radical beam 112, so that the flux of radicals from radical beam 112 may define an average angle of incidence, where the individual trajectories of radicals do not diverge substantially from one another. In other words, the angular spread about the angle of incidence $\square_R$ may be limited to a few degrees, 10 degrees or 20 degrees in different non-limiting embodiments . . . .

Thus, the system 100 provides a combination of components to increase flexibility in substrate processing with energetic species, by decoupling ion beam treatment from radical beam treatment, where the composition and geometry of radical beam and ion beam are independently controllable. This configuration facilitates new capabilities, including better control of reactive ion etching processes, reactive deposition processes, ion implantation processes, as well as more precise control of treatment of three dimensional structures in a substrate.

Figure 2:
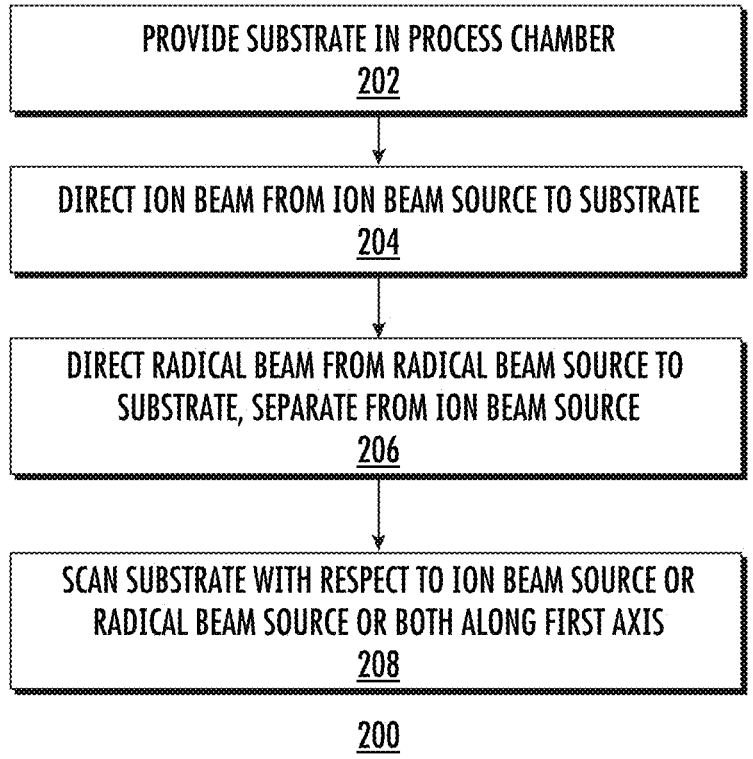
FIG. 2 presents an exemplary process flow.

FIG. 2 presents an exemplary process flow 200. At block 202, a substrate is provided in a process chamber. At block 204, an ion beam is directed to the substrate from an ion beam source. The ion beam source may be coupled to generate ions of any suitable species, and may be movable so as to adjust the angle of incidence of the ion beam with respect to the substrate. At block 206 a radical beam is directed to the substrate from a radical beam source, separate from the ion beam source. Notably, the radical beam source may be used in conjunction with the ion beam source to process the substrate, for an operation such as etching, deposition, implantation, and the like. At block 208, the substrate is scanned with respect to the ion beam source, radical beam source, or both, while the radical beam and ion beam are directed to the substrate. For example, during the scanning of the substrate, the substrate may be scanned along a horizontal direction, such as a Y-axis, while a separation between the substrate and the radical beam source and ion beam source along a vertical direction, such as a Z-axis, remains constant. As such, the ion beam and radical beam may differ in beam composition, beam including beam angle of incidence, relative motion with respect to the substrate during processing, or a combination of the above.

The present embodiments provide at least the following advantages. The present embodiments allow ion and radical treatment for a substrate to be tuned separately and independently to achieve the best process. For instance, in the case where the best ion source output is achieved at a relatively lower pressure and the best radical beam treatment is achieved at a relatively higher pressure, the present embodiments enable both of these conditions to be met without compromise. The present embodiments have the further advantage of providing the ability to perform substrate processing in a common system, using very different source types, such as a RF based-radical source and hot cathode-based ion source is can be employed. A further advantage to the present embodiments is the ability to match the output of a radical beam source and ion beam source, where the radical treatment or the ion beam treatment may otherwise be rate limiting in a system lacking two independent sources.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
   providing a substrate in a process chamber;
   directing an ion beam to the substrate from an ion beam source; and
   directing a radical beam to the substrate from a radical beam source, separate from the ion beam source, wherein the directing the ion beam to the substrate comprises scanning the ion beam with respect to the substrate, using an ion beam source scanner;
   wherein the ion beam comprises a ribbon ion beam, and wherein the radical beam comprises a ribbon radical beam.

2. The method of claim 1, wherein the ion beam and the radical beam perform a set of processing procedures on the substrate, including etching the substrate, depositing a material on the substrate, implanting a species into the substrate, or any combination thereof.

3. The method of claim 1, wherein at least one of the ion beam and the radical beam is directed to the substrate at a non-zero angle of incidence with respect to a normal to a main plane of the substrate.

4. The method of claim 1, wherein the directing the radical beam comprises scanning the radical beam with respect to the substrate, using a radical beam source scanner.

5. The method of claim 1, wherein the scanning the ion beam takes place along a scan plane parallel to a main plane of the substrate, wherein the ion beam is scanned in a two dimensional manner within the scan plane.

6. The method of claim 1, wherein the scanning the ion beam takes place along a scan plane parallel to a main plane of the substrate, the method further comprising scanning the substrate within the scan plane during the scanning the ion beam.

7. The method of claim 6, wherein the scanning the ion beam takes place along a first direction, and wherein the scanning the substrate takes place along a second direction, perpendicular to the first direction.

8. The method of claim 1,
   wherein the scanning the ion beam comprises:
      translating the ion beam along a first direction with respect to the substrate; and
      translating the ion beam along a second direction, perpendicular to the first direction, with respect to the substrate,
   and wherein the scanning the radical beam comprises:
      translating the radical beam along the first direction with respect to the substrate; and
      translating the radical beam along the second direction with respect to the substrate.

9. The method of claim 1, the process chamber further comprising a barrier that is disposed between the ion beam source and the radical beam source.

10. A method, comprising:
   providing a substrate in a process chamber;
   directing an ion beam to the substrate from an ion beam source; and
   directing a radical beam to the substrate from a radical beam source, separate from the ion beam source, wherein the directing the radical beam to the substrate comprises scanning the radical beam with respect to the substrate, using a radical beam source scanner;
   wherein the ion beam comprises a ribbon ion beam, and wherein the radical beam comprises a ribbon radical beam.

11. The method of claim 10, wherein the ion beam and the radical beam perform a set of processing procedures on the substrate, including etching the substrate, depositing a material on the substrate, implanting a species into the substrate, or any combination thereof.

12. The method of claim 10, wherein at least one of the ion beam and the radical beam is directed to the substrate at a non-zero angle of incidence with respect to a normal to a main plane of the substrate.

13. The method of claim 10, wherein the scanning the radical beam takes place along a scan plane parallel to a main plane of the substrate, wherein the radical beam is scanned in a two dimensional manner within the scan plane.

14. The method of claim 10, wherein the scanning the radical beam takes place along a scan plane parallel to a main plane of the substrate, the method further comprising scanning the substrate within the scan plane during the scanning the radical beam.

15. The method of claim 14, wherein the scanning the radical beam takes place along a first direction, and wherein the scanning the substrate takes place along a second direction, perpendicular to the first direction.

16. The method of claim 10, the process chamber further comprising a barrier that is disposed between the ion beam source and the radical beam source.

* * * * *